(12) United States Patent
Schober

(10) Patent No.: US 8,408,945 B2
(45) Date of Patent: Apr. 2, 2013

(54) ELECTRONIC DEVICE HAVING A CAN HOUSING AND METHOD FOR PRODUCING THE SAME

(75) Inventor: Franz Schober, Bad Abbach (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 13/123,797

(22) PCT Filed: Oct. 7, 2009

(86) PCT No.: PCT/EP2009/063032
§ 371 (c)(1),
(2), (4) Date: Apr. 12, 2011

(87) PCT Pub. No.: WO2010/043525
PCT Pub. Date: Apr. 22, 2010

(65) Prior Publication Data
US 2011/0256777 A1 Oct. 20, 2011

(30) Foreign Application Priority Data
Oct. 14, 2008 (DE) .......................... 10 2008 051 547

(51) Int. Cl.
*H01R 24/00* (2011.01)
(52) U.S. Cl. ...................................................... 439/660
(58) Field of Classification Search .................. 439/660, 439/76.1, 76.2, 74
See application file for complete search history.

(56) References Cited

U.S. PATENT DOCUMENTS

| | | | | |
|---|---|---|---|---|
| 3,766,439 A | | 10/1973 | Isaacson ........................ | 317/100 |
| 3,971,127 A | * | 7/1976 | Giguere et al. ................. | 29/827 |
| 4,066,851 A | * | 1/1978 | White et al. .................... | 200/5 A |
| 4,489,999 A | * | 12/1984 | Miniet ............................. | 439/67 |
| 4,781,601 A | * | 11/1988 | Kuhl et al. ..................... | 439/77 |
| 5,103,375 A | * | 4/1992 | Cottingham et al. .......... | 361/715 |
| 5,170,326 A | * | 12/1992 | Meny et al. .................... | 361/736 |

(Continued)

FOREIGN PATENT DOCUMENTS

| | | |
|---|---|---|
| DE | 2747894 | 5/1979 |
| DE | 3524035 | 1/1987 |

(Continued)

OTHER PUBLICATIONS

International PCT Search Report, PCT/EP2009/063032, 16 pages, Dec. 11, 2009.

*Primary Examiner* — Jean F Duverne
(74) *Attorney, Agent, or Firm* — King & Spalding L.L.P.

(57) ABSTRACT

An electronic device (1) has a can housing (3) and a method for producing the same. The can housing (3) has an open end face (4). A plug-in unit (5) can be inserted into the can housing (3) through the end face (4). The plug-in unit (5) has a populated circuit board (6) and a multicontact connector (7). The can housing (3) has an integrated connector collar (8), which integrally extends the can housing (3) and surrounds the multicontact connector (7) and contact elements (9). The connector collar (8) forms a fit for a mating connector. The insert has the circuit board (6) and a contact carrier (10) having the multicontact connector (7) without the connector collar (8). The outer contour (11) of the contact carrier (10) is at least partially matched to the inner contour (12) of the connector collar (8).

14 Claims, 5 Drawing Sheets

U.S. PATENT DOCUMENTS

| | | | | |
|---|---|---|---|---|
| 5,179,501 A | * | 1/1993 | Ocken et al. | 361/709 |
| 5,446,626 A | | 8/1995 | Dittmann et al. | 361/785 |
| 6,094,349 A | | 7/2000 | Fassel et al. | 361/704 |
| 6,699,730 B2 | * | 3/2004 | Kim et al. | 438/107 |
| 7,246,431 B2 | * | 7/2007 | Bang et al. | 29/835 |
| 7,413,463 B2 | | 8/2008 | Matsuo | 439/377 |
| 2010/0045790 A1 | * | 2/2010 | Lynam et al. | 348/140 |

FOREIGN PATENT DOCUMENTS

| | | |
|---|---|---|
| DE | 3841893 A1 | 6/1990 |
| DE | 3936906 | 5/1991 |
| DE | 4323827 C1 | 12/1994 |
| DE | 19734110 C1 | 11/1998 |
| DE | 102004002562 A1 | 8/2005 |

* cited by examiner

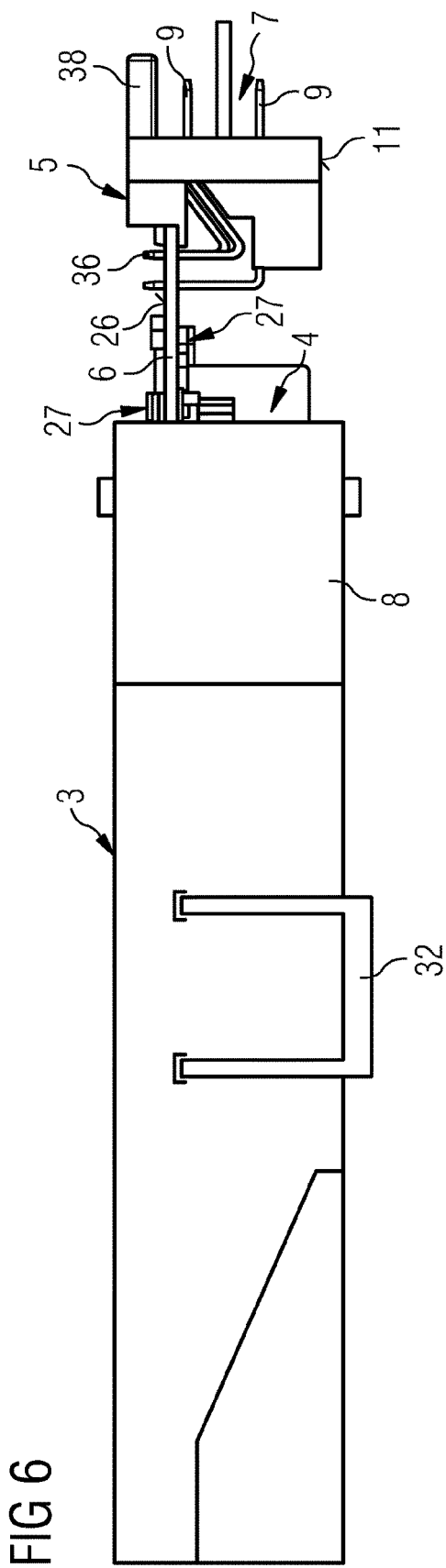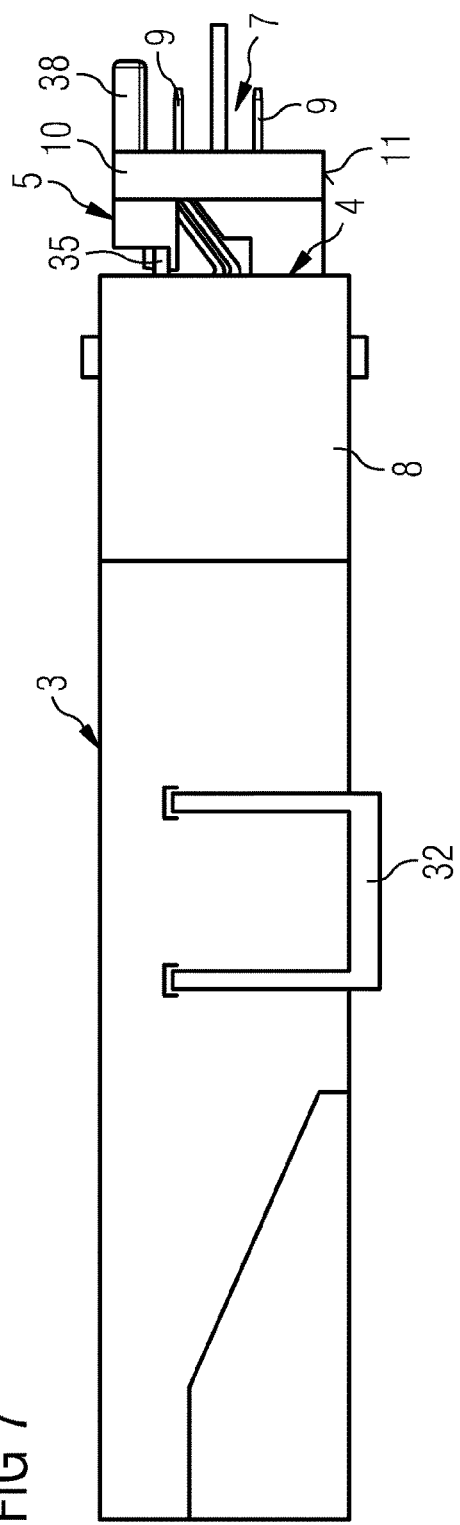

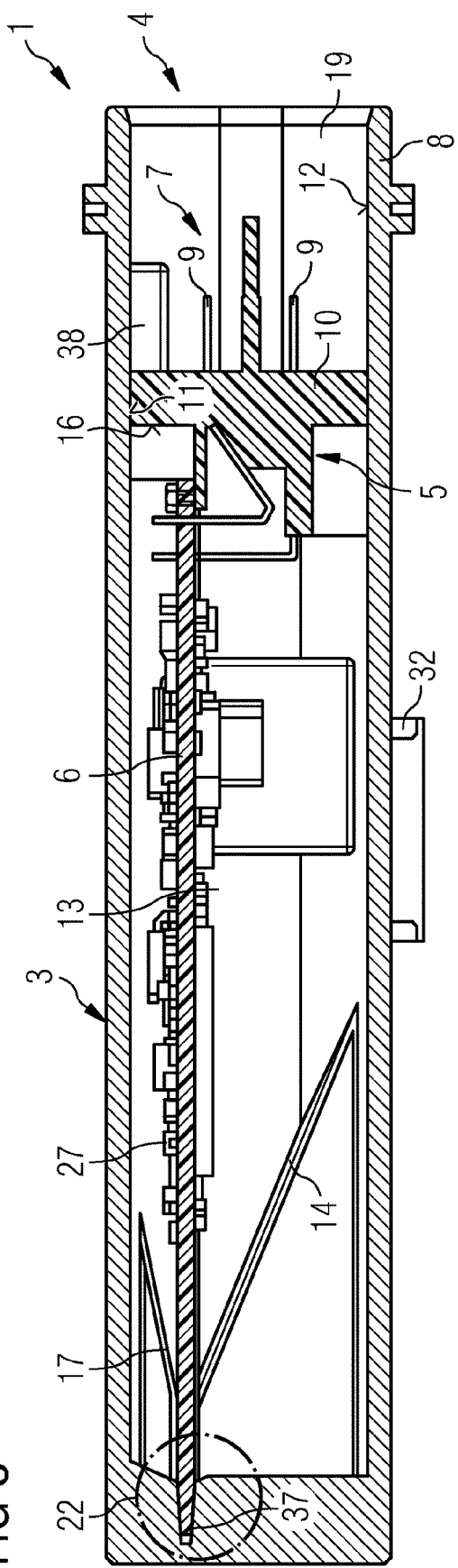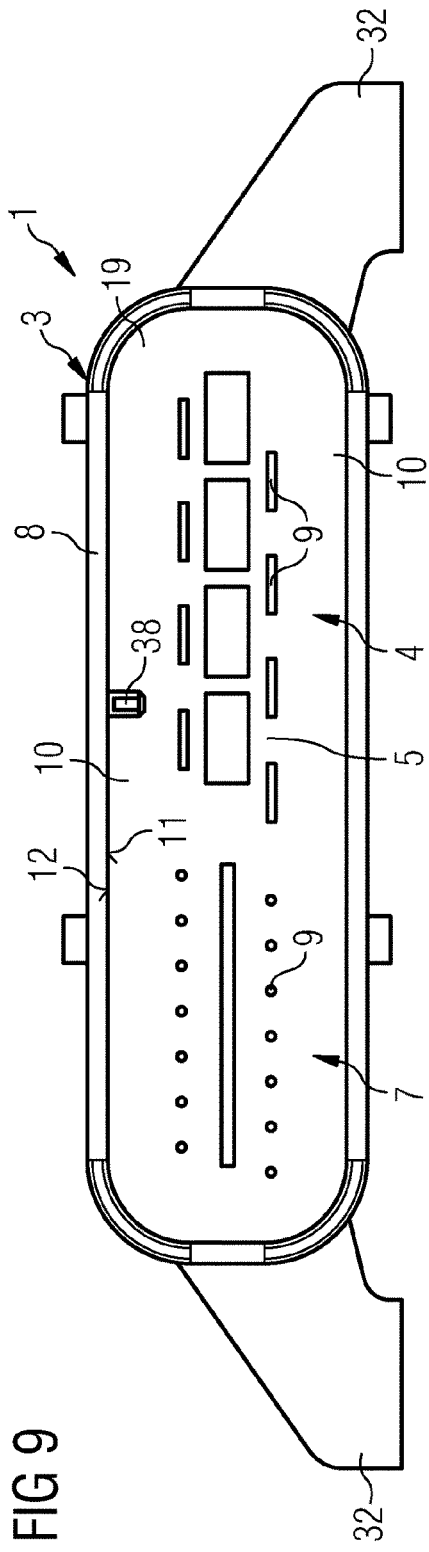

ELECTRONIC DEVICE HAVING A CAN HOUSING AND METHOD FOR PRODUCING THE SAME

CROSS-REFERENCE TO RELATED APPLICATIONS

This application is a U.S. National Stage Application of International Application No. PCT/EP2009/063032 filed Oct. 7, 2009, which designates the United States of America, and claims priority to German Application No. 10 2008 051 547.7 filed Oct. 14, 2008, the contents of which are hereby incorporated by reference in their entirety.

TECHNICAL FIELD

The invention relates to an electronic device having a can housing, and to a method for producing the same. The can housing has an open end face. A plug-in unit can be inserted into the can housing via the end face. The plug-in unit has a populated printed circuit board and a multicontact connector.

BACKGROUND

This plug-in unit can housing concept is a widespread control device concept which is known from document DE 3936906 C2 for motor vehicle electronics, in order to protect the electronic device from contamination. For this purpose, the multicontact connector not only has contact elements but is also surrounded by a connector collar in which the connecting elements of the multicontact connector are arranged, wherein the contact elements are encapsulated by injection molding with a plastics material which forms an integrated unit with the connector collar. A printed circuit board assembly composed of a populated printed circuit board is arranged on this unit composed of contact elements, contact carrier and connector collar, and forms a plug-in unit which can be inserted into the can housing which has, on an open end face, a peripheral seal which, when the electronic device is assembled, seals the can housing in that a cover which is integrally injection molded onto the connector collar covers the open end face of the can housing.

Such a known plug-in unit can housing concept is shown with FIG. 10. The concept has a plastics can housing 3 with an open end face 4 and a clear width w, wherein a peripheral groove 30 is arranged on the open end face 4, which peripheral groove 30 can accommodate a sealing element 29. A printed circuit board assembly 31, which is composed of a populated printed circuit board 6 and a multicontact connector 7, can be inserted into the can housing 3, wherein the edge regions 26 of the printed circuit board 6 slide into the can housing 3 along the guide grooves 24. In this context, the open end face is covered by a cover 28 which is integrally injection molded onto the multicontact connector 7. The joint between the multicontact connector 7 and the can housing is therefore on the outside and is therefore subjected to all environmental influences.

For this reason, this concept is predominantly applied in the passenger compartments of vehicles and is not used for hermetically sealed electronic devices. Implementing this can housing concept for sealed control device applications, in particular in vehicle engineering, requires extensive sealing measures at the joint between the can housing 3 and the connector region. For this purpose, the connection between the can housing 3 and the connector with the printed circuit board assembly 31 has to be additionally hermetically sealed by means of the sealing element 29.

In this context, additional materials such as silicone insertion seals or bonding agents such as polyurethane adhesives are used. Such sealing measures will require additional processes and additional materials and therefore give rise to increased material costs and fabrication costs. Furthermore, the introduction of sealing measures requires additional space, as FIG. 10 shows with the sealing groove 30, as a result of which the outer dimensions of such electronic devices, in particular control devices for motor vehicles, are increased disadvantageously.

SUMMARY

According to various embodiments, the disadvantages of the prior art can be overcome and a new plug-in unit can housing concept can be developed which can form a hermetic protection for the electronic device with a reduced requirement for space and without sealing elements. In addition, according to other embodiments a method for producing such an electronic device can be provided.

According to an embodiment, an electronic device may have a can housing having: —a can housing with an open end face via which a plug-in unit can be inserted into the can housing, wherein the plug-in unit has a populated printed circuit board and a multicontact connector, wherein the can housing has an integrated connector collar which integrally extends the can housing and surrounds the multicontact connector with contact elements and forms a fit for a mating connector, and wherein the plug-in unit has the printed circuit board and a contact carrier with the multicontact connector without the connector collar, wherein the outer contour of the contact carrier is at least partially matched to the inner contour of the connector collar.

According to a further embodiment, the interior of the can housing may have guide ramps for insertion of the printed circuit board into an end position. According to a further embodiment, the connector collar may have an opening with dimensions which correspond to the width of the plug-in unit composed of the printed circuit board with the contact carrier. According to a further embodiment, the can housing may have an interior which has clamping regions and locking regions for the printed circuit board. According to a further embodiment, the can housing may have, in the interior, lateral guide grooves which are in engagement with edge regions of the printed circuit board. According to a further embodiment, the electronic device can be a device of a vehicle and preferably may have a device of the group comprising electronic parking brake, electronic guidance device, engine control device, transmission control device, antilock braking device or electronic safety control device.

According to a further embodiment, a method for producing an electronic device having a can housing, may have the following method steps: —manufacture of a can housing with an integral connector collar which corresponds in its dimensions to the interior of the can housing; —production of a printed circuit board with populating elements, the width of which printed circuit board corresponds to a clear width of the can housing; —production of a contact carrier with contact elements of a multicontact connector, wherein the outer contour of the contact carrier is at least partially matched to the inner contour of the connector collar; —connection of the contact carrier to the printed circuit board to form a compact plug-in unit; and—insertion of the compact plug-in unit into the can housing accompanied by positioning of the contact carrier with the multicontact connector in the connector collar of the can housing.

According to a further embodiment of the method, the can housing may be produced with an integral connector collar by means of injection molding technology. According to a further embodiment of the method, the contact elements may be embedded in the contact carrier by means of an injection molding method. According to a further embodiment of the method, in order to produce the contact carrier, contact elements can be produced which are inserted into a prefabricated injection molded part with the outer contour of the contact carrier in prefabricated slit-shaped guide openings in the injection molded part and are connected in a frictionally locking or materially joined fashion to the injection molded part to form a contact carrier.

BRIEF DESCRIPTION OF THE DRAWINGS

The invention will now be explained in more detail with reference to the appended figures.

FIGS. 4 to 9 show schematic views of device components of the electronic device according to the embodiments;

FIG. 4 shows a schematic end side view of the can housing;

FIG. 5 shows a schematic side view of the can housing after partial introduction of a compact plug-in unit into the can housing according to FIG. 4;

FIG. 6 shows a schematic side view of the can housing according to FIG. 4 after further insertion of the plug-in unit;

FIG. 7 shows a schematic side view of the can housing according to FIG. 6 after almost complete introduction of the plug-in unit into the can housing;

FIG. 8 shows a schematic lateral view through the electronic device after complete introduction of the plug-in unit according to FIG. 7;

FIG. 9 shows a schematic end side view of the electronic device according to FIG. 8.

DETAILED DESCRIPTION

Figure 1:
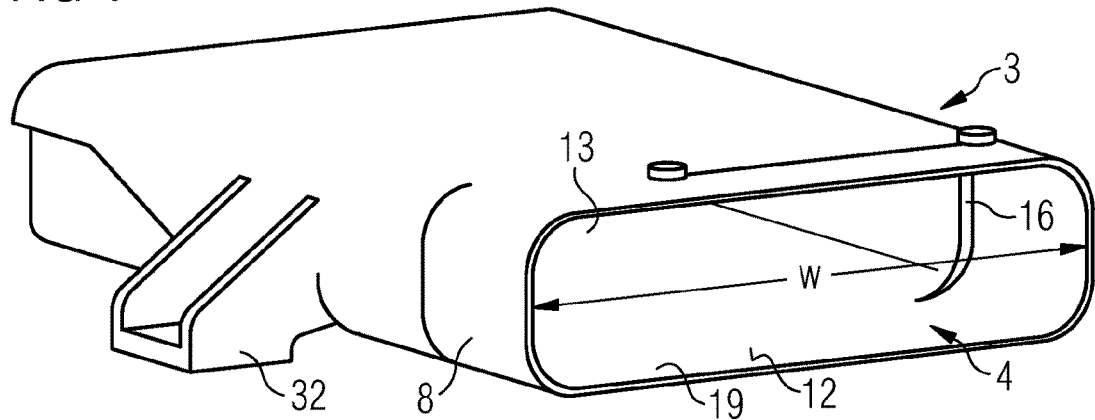
FIG. 1 shows a schematic perspective view of a can housing according to an embodiment.

According to various embodiments, an electronic device can be provided having a can housing and a method for producing the same. The can housing has an open end face. A plug-in unit can be inserted into the can housing via the end face. The plug-in unit has a populated printed circuit board and a multicontact connector. The can housing has an integrated connector collar which integrally extends the can housing and surrounds the multicontact connector with contact elements. The connector collar forms a fit for a mating connector. The plug-in unit has the printed circuit board and a contact carrier with the multicontact connector without the connector collar. In this context, the outer contour of the contact carrier is at least partially matched to the inner contour of the connector collar of the can housing.

Such an electronic device has the advantage that there is no need for a joint between a plug-in unit and the can housing. Instead, the number of components to be joined together is reduced by the separation of the multicontact connector and the surrounding connector collar. Since the connector collar now directly extends the can housing and forms an integral unit with the can housing, the joint shown in FIG. 10 composed of an externally located sealing groove with a sealing element and a sealing cover plate for the open end face of the can housing is dispensed with. These complex components are dispensed with completely, with the result that the stock keeping can be reduced, the outer dimensions of the housing can shrink and the assembly costs for such an electronic device can be significantly reduced.

The interior of the can housing preferably has guide ramps for insertion of the printed circuit board into an end position.

The assembly of the plug-in unit, which is composed of a populated printed circuit board and a multicontact connector which is secured to the printed circuit board and does not have a connector collar, is simplified. This does not require any sealing elements whatsoever. Although matching the outer contour of the contact carrier to the inner contour of the connector collar of the can housing does not produce a hermetic seal, such a seal is brought about when a mating connecting element is inserted into the multicontact connector within the connector collar. A double seal is not necessary for such control devices.

For this purpose, the connector collar preferably has an opening with dimensions which correspond to the width of the plug-in unit composed of the printed circuit board with the contact carrier. This ensures that a plug-in unit composed of a printed circuit board and a contact carrier with contacts of the multicontact connector can be installed without problems in the can housing with an integral connector collar. The interior of the can housing has clamping regions and locking regions for the printed circuit board, which ensures that when an end position is reached the printed circuit board with contact carriers is anchored in the can housing. Furthermore, there is provision that the can housing has, in the interior, lateral guide grooves which are in engagement with edge regions of the printed circuit board. These lateral guide grooves protect the printed circuit board in the interior of the can housing and ensure that the populated printed circuit board can be installed without problems in the can housing with an integral connector collar.

The electronic device is preferably a device of a vehicle and preferably has a device of the group comprising electronic parking brake (EPB), electronic guidance device, engine control device, transmission control device, antilock braking device (ABS) or electronic stability control device (ESP). Owing to the fitting of the multicontact connector into the connector collar, the electronic device can also be arranged in the engine region of a vehicle since a hermetic seal is produced by the associated mating connector which is equipped with a sealing element with respect to the inner contour of the connector collar.

A method for producing an electronic device having a can housing has the following method steps. Firstly, the can housing with an integral connector collar, which corresponds in its clear dimensions to the interior of the can housing, is produced. In addition, a printed circuit board with populating elements is produced, the width of which printed circuit board corresponds to a clear width of the can housing. Finally, a contact carrier with contact elements of a multicontact connector is produced, wherein the outer contour of the contact carrier corresponds to the inner contour of the connector collar.

After this, the contact carrier is firstly connected to the printed circuit board to form a compact plug-in unit. Then, the compact plug-in unit is inserted into the can housing accompanied by positioning of the contact carrier with the multicontact connector in the connector collar of the can housing.

This method has the advantage that it requires fewer process steps to produce an electronic device with a can housing concept. The production steps are simplified in such a way that even untrained personnel can carry out the assembly of the compact plug-in unit and can housing with a connector collar. In this context, the can housing with an integrated connector collar can be produced by means of injection molding technology in a single injection molding step, and the contact elements can be embedded in the contact carrier itself by means of an injection molding method.

Since injection molding systems for an injection molding method of contact carriers and of can housings are automated, precise mass fabrication of the components of the electronic device is possible. Alternatively, in order to produce the contact carrier, contact elements can be firstly produced which are inserted into a prefabricated injection molded part with the outer contour of the contact carrier in prefabricated slit-shaped guide openings in the injection molded part and are connected in a frictionally locking or materially joined fashion to the injection molded part to form a contact carrier. This method variant has the advantage that there is no need to keep available a special tool for injecting contact elements during the injection molding method, but rather a mass-produced part in the form of a prefabricated injection molded part with an outer contour of the contact carrier with prefabricated slit-shaped guide openings can be made available, and the prefabricated contact elements can be inserted with corresponding automatic assembly devices into the guide openings in this injection molded part.

In summary, it is to be noted that with the new can housing concept the electronic device has the following advantages over the prior art:

1. a complete sealing level is dispensed with by virtue of the relocation of the joint level into the interior of the connector; 2. as a result, sealing material such as polyurethane adhesive or silicone seals are eliminated; in addition 3. process steps such as the provision of a seal, the curing of a seal and/or carrying out testing of tightness are eliminated; furthermore, 4. a reduction in the outer dimensions of the housing with respect to the height of the housing and the width of the housing is achieved; in addition 5. a reduction in the overall weight is achieved owing to the reduced overall size;

6. in this context, the material costs are reduced; and 7. the fabrication costs are reduced; and finally 8. a new control device concept with hermetically protected control device components is obtained.

FIG. 1 shows a schematic perspective view of a can housing 3 according to an embodiment. This can housing 3 has attachment clips 32 with which the can housing 3 can be secured, for example, in a vehicle. In addition, a connector collar 8 is integrally injection molded onto the can housing 3 on the open end face 4, the inner contour 12 of which connector collar 8 has a clear width w which corresponds to the clear width of the interior of the can housing 3. In addition, at the junction between the connector collar 8 and the inner region of the can housing 3 a stop can be seen as an end position 16 in the interior of the can housing 3, which stop forms a locking means for the plug-in unit 5 shown in FIG. 2.

Figure 2:
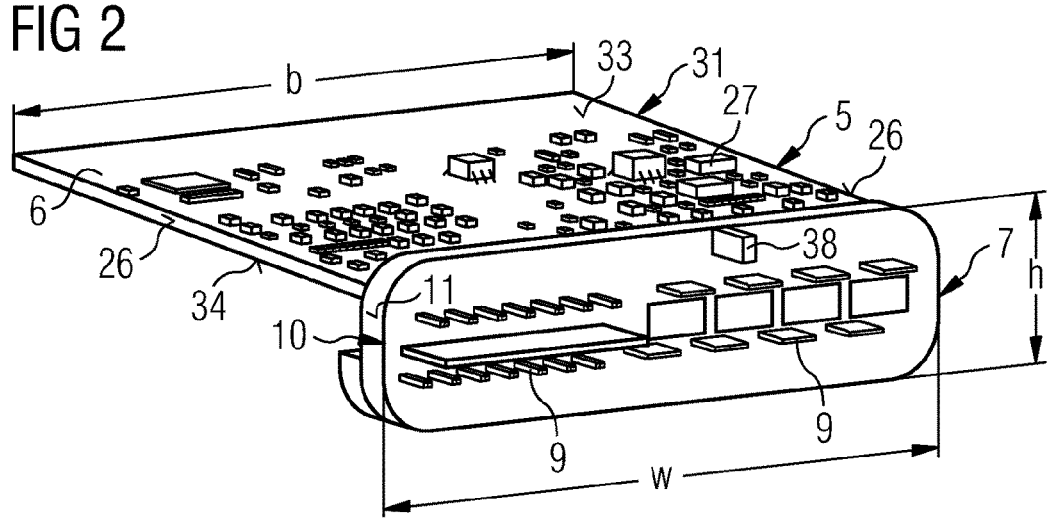
FIG. 2 shows a schematic perspective view of a compact plug-in unit for the can housing according to FIG. 1.

FIG. 2 shows a schematic perspective view of a compact plug-in unit 5 for the can housing 3 according to FIG. 1. This compact plug-in unit 5 comprises a printed circuit board 6 with edge regions 26 which can be populated on its upper side 33 and its lower side 34 with components. This printed circuit board 6 is connected to a multicontact connector 7 which, however, does not have a connector collar but instead possesses only contact elements 9 in a contact carrier 10. Furthermore, a coding fin 38, which serves to guide and code a mating connector, is integrally formed onto the contact carrier. The outer contour 11 of the contact carrier 10 is matched here both in width and in height h to the clear dimensions of the integral connector collar 8, as is shown in FIG. 1. The width b of the printed circuit board is, moreover, matched to the distance between the guide grooves shown in FIG. 4.

Figure 3:
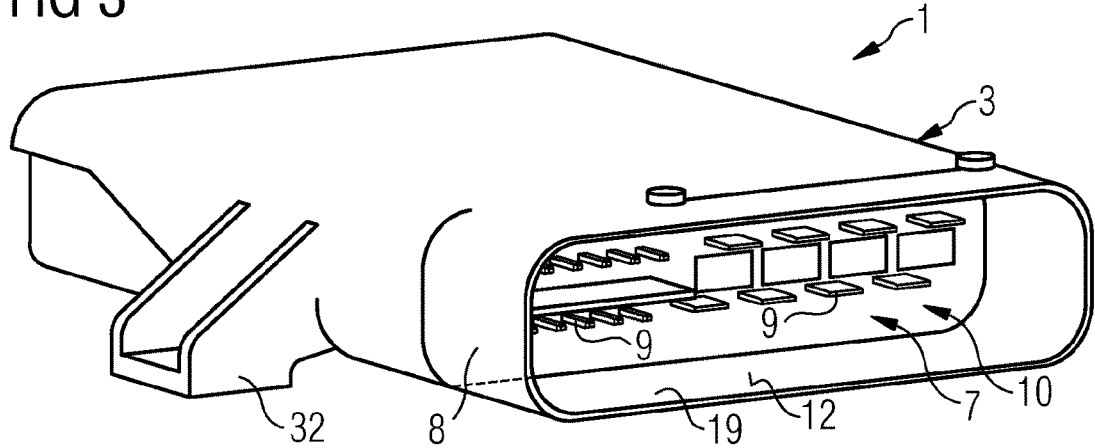
FIG. 3 shows a schematic perspective view of an electronic device according to an embodiment.

FIG. 3 shows a schematic perspective view of an electronic device 1 according to an embodiment after assembly of the device components shown in FIG. 1 and FIG. 2. For this purpose, the compact plug-in unit 5 is, as is shown in FIG. 2, merely inserted into the can housing 3 with an integral connector collar 8 until the end position 16 (shown in FIG. 1) for the contact carrier 10, as is shown in FIG. 2, is reached. For example, the multicontact connector 7 can be secured in the connector collar 8 by means of snap-action hooks or screws. Since basically and according to standard practice the seal of the connector interior is ensured by the mounting of the mating connector, a hermetic seal is therefore automatically produced when a mating connector is introduced into the multicontact connector 7 with the connector collar 8, without additional joint levels having to be sealed. The joint level between the printed circuit board assembly 31 and the can housing 3 is therefore relocated into the inner region of the multicontact connector 7 with a connector collar 8, wherein the integration of the connector collar 8 with the can housing 3 to form a single injection molded part ensures the mounting of the printed circuit board assembly 31 through the open end face 4.

Figure 4:
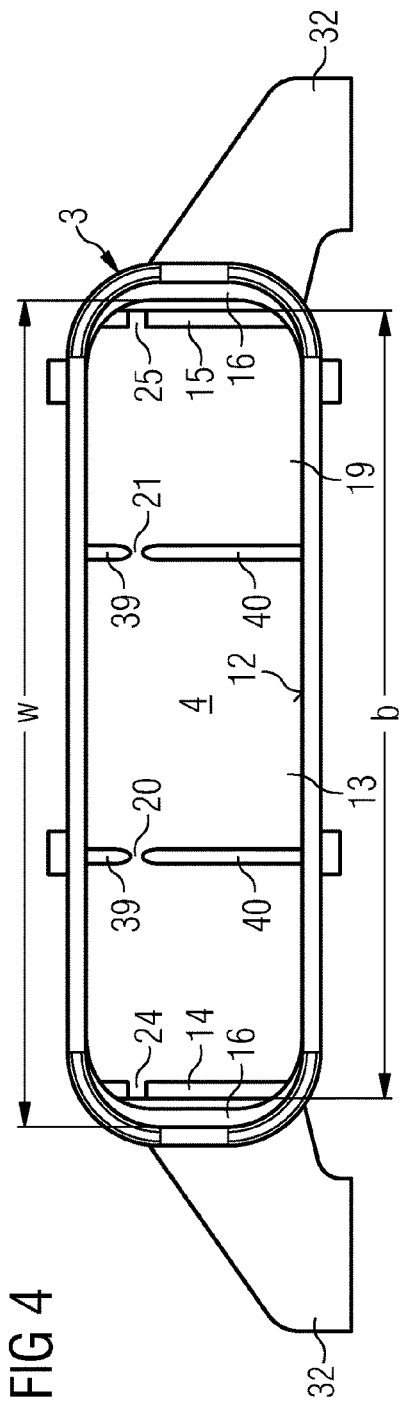

FIGS. 4 to 9 show schematic views of device components of the electronic device 1 according to the embodiment. In this respect, FIG. 4 shows a schematic end side view of the can housing 3. This end side view ensures a view into the interior of the can housing 3 and at the same time shows the external attachment clips 32 which have already been mentioned above and which permit secure mounting of such a can housing 3 in a vehicle, for example.

The interior 13 has different clamping regions 20 and 21 between the upper clamping fins 39 and the lower clamping fins 40 in the rear part of the can housing 3. Guide grooves 24 and 25, into which the edge regions of the printed circuit board can be inserted, are arranged on the sides. Furthermore, lower guide ramps 14 and 15 and upper guide ramps 17 and 18, which guide the rear end of a printed circuit board, are arranged on the sides in the rear region of the can housing 3. The distance between the lateral guide grooves 24 and 25 is decisive for the width b of the printed circuit board to be inserted. The rear clamping regions 20 and 21 are matched in their size to the thickness of the printed circuit board.

Figure 5:
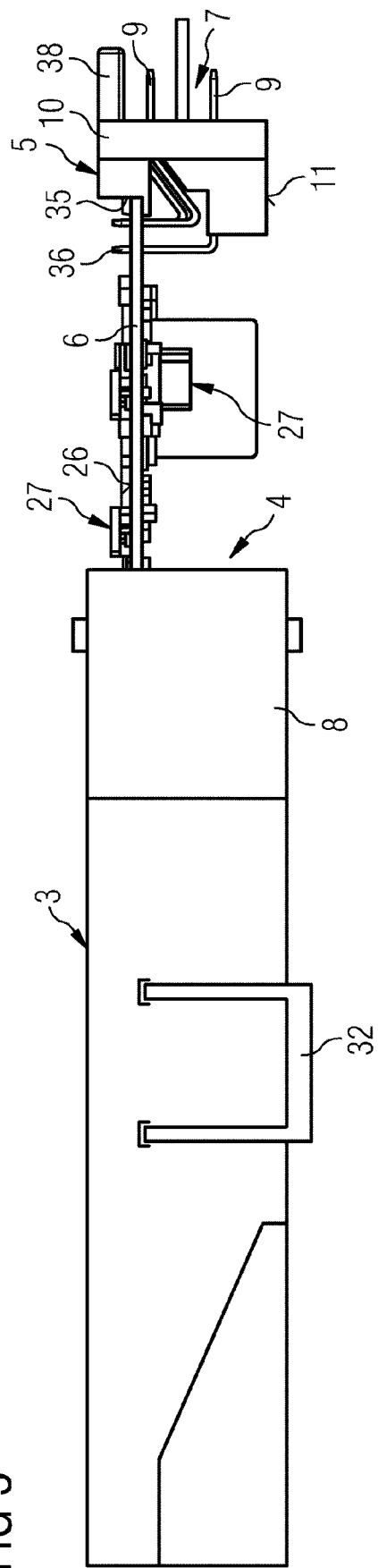

FIG. 5 shows a schematic side view of the can housing 3 after partial introduction of the compact plug-in unit 5 into the can housing 3 according to FIG. 4. The populating elements 27 of the printed circuit board 6 are matched to the clear height of the can housing 3 in such a way that the different populating components 27 can be readily arranged in the interior of the can housing 3. The printed circuit board 6 is secured with a front edge 35 to the contact carrier 10, wherein the contact carrier 10 can be composed of an injection molded material which has the contact elements 9. In this context, inner ends 36 of the contact elements 9 are bent toward the printed circuit board 6 and connected to corresponding current-conducting conductor tracks of the printed circuit board 6. This connection can be embodied in a frictionally locking, positively locking or else materially joined fashion.

FIG. 6 shows a schematic side view of the can housing 3 according to FIG. 5 after further introduction of the plug-in unit 5 into the interior of the can housing 3. In this context, the population elements 27 of the printed circuit board 6 are arranged in the can housing 3, and the printed circuit board 6 is guided in the guide grooves as are shown in FIG. 4.

FIG. 7 shows a schematic side view of the can housing 3 according to FIG. 6 after almost complete introduction of the plug-in unit 5. For this purpose, the outer contour 11 of the contact carrier 10 is at least partially matched to the inner contour of the connector collar 8, with the result that by further insertion of the compact plug-in unit 5 into the can housing 3 the multicontact connector can be completely mounted. FIG. 8 shows a schematic cross section through the electronic device 1 after complete introduction of the plug-in unit 5 according to FIG. 7. In this context, the compact plug-in unit 5 has reached an end position 16 against which the contact carrier 10 abuts. In this position, the corresponding contact elements 9 are arranged in the connector collar 8, and together with the connector collar 8 they then form the multicontact connector 7, wherein the contact carrier 10 is at least partially matched with its outer contour 11 to the inner contour 12 of the connector collar 8. A seal with respect to gaseous, liquid or solid impurities is not brought about until a corresponding mating connector is inserted into the collar connector 8. In the rear region it is possible to see the abovementioned lower guide ramps 14 and upper guide ramps 17 which insert a rear edge region of the printed circuit board 6 into a locking region 22, with the result that the printed circuit board 6 is secured, on the one hand, by the lateral guide grooves and, on the other hand, by the locking region 22 in the interior 13 of the can housing 3.

FIG. 9 shows a schematic end side view of the electronic device 1 according to FIG. 8. This end side view shows the open end face 4 of the connector collar 8 in which the outer contour 11 of the contact carrier 10 is at least partially fitted into the inner contour 12 of the connector collar 8. This position can be secured mechanically in a frictionally locking or positively locking or in a materially joined fashion when the end position 16 is reached, as is shown in FIG. 8.

Figure 10:
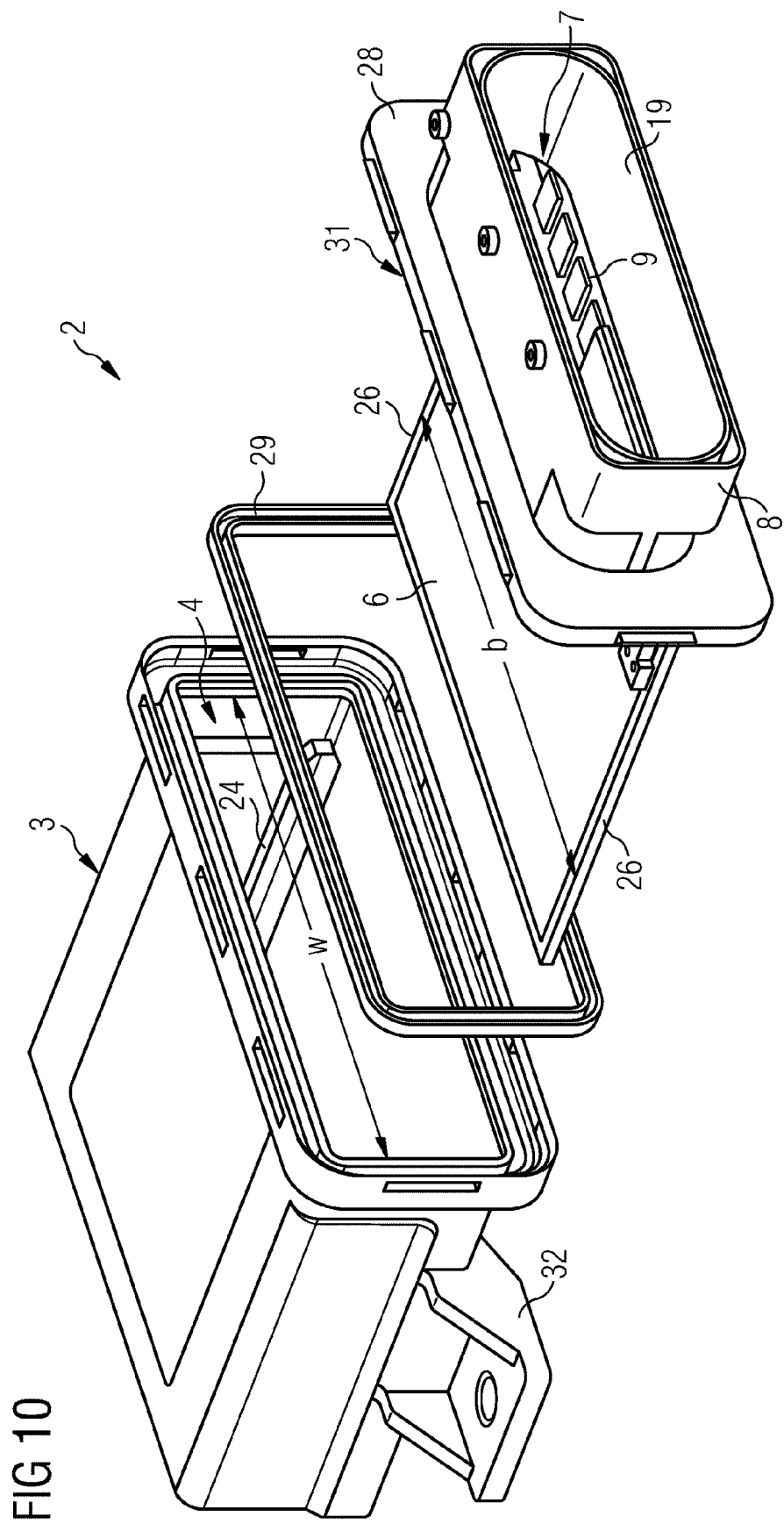
FIG. 10 shows a schematic perspective and exploded view of an electronic device according to a known can housing concept.

FIG. 10 shows a schematic exploded perspective view of an electronic device 2 according to a known can housing concept, which has already been described in the introduction, so that a repetition will not be given at this point. List of reference symbols 1 Electronic device (embodiment)
2 Electronic device (prior art)
3 Can housing
4 Open end face
5 Plug-in unit
6 Populated printed circuit board
7 Multicontact connector
8 Connector collar
9 Contact element
10 Contact carrier
11 Outer contour of the contact carrier
12 Inner contour of the connector collar
13 Interior of the can housing
14 Guide ramp (lower)
15 Guide ramp (lower)
16 End position
17 Guide ramp (upper)
18 Guide ramp (upper)
19 Opening of the connector collar
20 Clamping region
21 Clamping region
22 Locking region
24 Lateral guide groove
25 Lateral guide groove
26 Edge region of the printed circuit board
27 Populating elements of the printed circuit board
28 Cover
29 Sealing element
30 Groove
31 Printed circuit board assembly
32 Attachment clip
33 Upper side
34 Lower side
35 Front end
36 Inner ends of the contact elements
37 Rear edge region of the printed circuit board
38 Coding fin
39 Upper clamping fin
40 Lower clamping fin
b Width of the plug-in unit
h Height of the contact carrier
w Clear width of the can housing

The invention claimed is:

1. An electronic device having a can housing having:
    a can housing with an open end face via which a plug-in unit can be inserted into the can housing, wherein the plug-in unit comprises a populated printed circuit board and a multicontact connector including a contact carrier that carries contact elements electrically connected to the printed circuit board,
    wherein the can housing has an integrated connector collar which integrally extends the can housing and which defines an opening sized and shaped to receive the populated printed circuit board and multicontact connector of the plug-in unit during insertion of the plug-in unit into the can housing, such that in an inserted position of the plug-in unit, the integrated connector collar surrounds the multicontact connector having the contact elements, and
    wherein the plug-in unit is formed as a physically separate component from the can housing having the connector collar, and
    wherein an outer contour of the contact carrier is at least partially matched to an inner contour of the connector collar.

2. The electronic device according to claim 1, wherein the interior of the can housing has guide ramps for insertion of the printed circuit board into an end position.

3. The electronic device according to claim 1, wherein the connector collar has an opening with dimensions which correspond to the width of the plug-in unit composed of the printed circuit board with the contact carrier.

4. The electronic device according to claim 1, wherein the can housing has an interior which has clamping regions and locking regions for the printed circuit board.

5. The electronic device according to claim 1, wherein the can housing has, in the interior, lateral guide grooves which are in engagement with edge regions of the printed circuit board.

6. The electronic device according to claim 1, wherein the electronic device is a device of a vehicle.

7. An electronic device having a housing comprising
    an open end face via which a plug-in unit having a printed circuit board and a multicontact connector including a contact carrier that carries contact elements electrically connected to the printed circuit board can be inserted into the housing, and
    an integrated connector collar which integrally extends the housing and which defines an opening sized and shaped to receive the populated printed circuit board and multicontact connector of the plug-in unit during insertion of the plug-in unit into the housing, such that in an inserted position of the plug-in unit, the integrated connector collar surrounds the multicontact connector having the contact elements, and wherein the plug-in unit is formed as a physically separate component from the housing having the connector collar, wherein an outer contour of the contact carrier is at least partially matched to an inner contour of the connector collar.

8. The electronic device according to claim 7, wherein the interior of the housing has guide ramps for insertion of the printed circuit board into an end position.

9. The electronic device according to claim 7, wherein the connector collar has an opening with dimensions which correspond to the width of the plug-in unit composed of the printed circuit board with the contact carrier.

10. The electronic device according to claim 7, wherein the housing has an interior which has clamping regions and locking regions for the printed circuit board.

11. The electronic device according to claim 7, wherein the housing has, in the interior, lateral guide grooves which are in engagement with edge regions of the printed circuit board.

12. The electronic device according to claim 7, wherein the electronic device is a device of a vehicle.

13. The electronic device according to claim 12, wherein the electronic device has a device of the group consisting of electronic parking brake, electronic guidance device, engine control device, transmission control device, antilock braking device and electronic safety control device.

14. The electronic device according to claim 6, wherein the electronic device has a device of the group consisting of electronic parking brake, electronic guidance device, engine control device, transmission control device, antilock braking device and electronic safety control device.

* * * * *